United States Patent [19]

Johnston, Jr. et al.

[11] Patent Number: 4,738,934
[45] Date of Patent: Apr. 19, 1988

[54] METHOD OF MAKING INDIUM PHOSPHIDE DEVICES

[75] Inventors: Wilbur D. Johnston, Jr., Mendham; Judith A. Long, Millburn; Albert T. Macrander, Summit; Bertram Schwartz, Westfield; Shobha Singh, Summit, all of N.J.

[73] Assignee: American Telephone and Telegraph Company, AT&T Bell Laboratories, Murray Hill, N.J.

[21] Appl. No.: 864,198

[22] Filed: May 16, 1986

[51] Int. Cl.$^4$ ................... H01L 21/265; H01L 21/24
[52] U.S. Cl. ........................................ 437/22; 357/24; 357/91; 437/29; 437/247
[58] Field of Search ................. 148/1.5, 175, 187; 29/571, 576 B, 569 L; 357/24, 91; 437/22

[56] References Cited

U.S. PATENT DOCUMENTS

| | | | |
|---|---|---|---|
| 4,404,172 | 9/1983 | Gault | 156/DIG. 83 |
| 4,505,023 | 3/1985 | Tseng et al. | 29/571 |
| 4,544,417 | 10/1985 | Clarke | 148/1.5 |
| 4,545,824 | 10/1985 | Salvi et al. | 148/1.5 |
| 4,546,540 | 10/1985 | Ueyanagi et al. | 29/576 B |
| 4,555,273 | 11/1985 | Collins et al. | 148/1.5 |
| 4,601,095 | 7/1986 | Kikuchi et al. | 29/571 |
| 4,611,388 | 9/1986 | Pande | 29/576 B |

OTHER PUBLICATIONS

Gauneau et al., J. Appl. Phys., 57 (1985), 1029.
Taylor et al., J. Vac. Sci. Technol., B-2 (1984), 522.
Bhattacharya et al., J. Appl. Phys., 55 (1984), 509.
Slater et al., Radiation Effects, 83 (1984), 219.
Journal of Crystal Growth 69, "Growth of Fe-Doped Semi-Insulating InP by MOCVD", J. A. Long, V. G. Riggs and W. D. Johnston, Jr., pp. 10-14 (1984).
Applied Physics Letters, "Electrical Characterization of Fe-Doped Semi-Insulating InP Grown by Metalorganic Chemical Vapor Deposition", A. T. Macrander et al., pp. 1297-1298, Dec. 1984.
Solid-State Electronics, vol. 23, "The Electrical Characteristics of InP Implanted with the Column IV Elements", J. P. Donnelly et al., pp. 1151-1154, 1980.
Applied Physics Letters, vol. 31, No. 7, "Ion-Implanted n- and p-Type Layers in InP", J. P. Donnelly et al., pp. 418-420, 1977.
Ion Implantation: Science and Technology, Academic Press, Inc., New York, 1984.
Ion Implantation: Equipment and Techniques, Springer-Verlag, New York, 1983.
Journal of the Electrochemical Society: Reviews and News, vol. 132, No. 8, "Dielectrics for Annealing of Ion-Implanted III-V Compound Semiconductors", S. Singh, Abstract No. 187, Las Vegas Meeting, 1985.

*Primary Examiner*—Upendra Roy
*Attorney, Agent, or Firm*—Walter G. Nilsen

[57] ABSTRACT

Epitaxial layers of semi-insulating InP grown by MOCVD on conducting InP wafers make excellent substrates for III-V semiconductor devices. Particularly appealing is the low defect density obtained because of the conducting InP wafers and excellent insulating characteristics of the semi-insulating InP layer. The invention is a procedure for doping the insulating layer by ion implantation. Such a procedure is unusually advantageous for fabricating a variety of devices including MISFETs, MESFETs and JFETs.

26 Claims, 2 Drawing Sheets

METHOD OF MAKING INDIUM PHOSPHIDE DEVICES

TECHNICAL FIELD

The invention is a process for making a semiconducting device comprising indium phosphide and resulting devices.

BACKGROUND OF THE INVENTION

The rapid development of both communication technology and computer technology has led to the requirement for faster, more sensitive, cheaper semiconductor devices with higher packing densities and more versatile performance. These requirements continue to grow and have resulted in the demand for better materials and better fabrication techniques.

Optical communications technology provides a particularly good example of this trend. Optical communications have been developing at a rapid rate over the last few years. High sensitivity in receivers is desirable because it increases the permitted distance between receivers and reduces the number of repeaters required in a particular communication system. Also of importance in optical communication systems are high speed amplifier systems which permit high bit rates to be transmitted. High speed amplifier systems are also used in other types of circuits including logic circuits, memory circuits, analog circuits, analog switching, high-input-impedance amplifiers, and integrated circuits. Also of interest are such integrated devices as optical detector-amplifier (e.g., PINFET) devices useful in optical communication systems.

One of the most interesting semiconductor compounds for a number of applications is indium phosphide and semiconductor compounds that can be lattice matched to indium phosphide (e.g., indium gallium arsenide, indium gallium arsenide phosphide, indium aluminum arsenide, indium aluminum arsenide phosphide, etc.). There are a number of reasons for this interest in indium phosphide and related compounds. First of all, a variety of interesting ternary and quaternary III-V compounds can be lattice matched to indium phosphide and can be grown as epitaxial layers on indium phosphide. Some of these layers (e.g., indium gallium arsenide phosphide with composition that is lattice matched to indium phosphide) have smaller band gaps than indium phosphide so that in a light emitting diode (LED) structure the indium phosphide is transparent to the emitted radiation. Thus, the output radiation of the LED can be transmitted through an indium phosphide substrate. Other types of layers that can be lattice matched to an indium phosphide substrate have attractive carrier transport properties. For example, indium gallium arsenide of suitable composition can be lattice matched to indium phosphide substrates and has extremely high mobilities. Such device structures provide for the possibility of extremely high speed devices and amplifier devices with high transconductances.

Also, the development of optical communication systems has influenced the importance of various semiconductor materials. For example, with many of the fiber optic materials now available, best performance is achieved in the radiation wavelength region around either 1.55 $\mu$m or, alternatively, near 1.3 $\mu$m. The quaternary system indium gallium arsenide phosphide can be adjusted in composition so that it is lattice matched to indium phosphide and has a band gap such as to emit radiation in the region of 1.55 $\mu$m. Another composition permits lattice matching in the 1.3 $\mu$m region. Thus, indium phosphide substrates with good material properties are highly desirable.

It is highly desirable to have a device surface low in defect density. High defect densities in indium phosphide substrates have a number of drawbacks in device fabrication and performance. First of all, epitaxial layers grown on such substrates are of poor quality, generally reproducing the high defect density of the substrate. Also, high defect densities have an adverse affect on etching and metalization processes used in device fabrication, making device fabrication difficult and yields low.

For integrated circuits, the requirements for low defect densities are even more stringent. Here, uniformity of the various units in the integrated circuit is necessary for optimum performance. For example, in integrated circuits with large collections of field effect transistors (FETs), defects in the semiconductor structure cause variations in the electrical properties (e.g., threshold voltage) of the individual FETs. This is highly undesirable in many types of integrated circuits, both analog and digital, such as logic circuits, memory circuits and amplifier circuits. Defects often lead to low yields in circuit fabrication. Also, in circuits such as PINFET structures, defects often affect optical properties as well as electrical properties.

Conventional bulk indium phosphide as well as semi-insulating indium phosphide (e.g., Fe-doped InP) have high defect densities that limit their usefulness in some applications. Both n-type and p-type bulk indium phosphide often have lower defect densities. Particularly good results are obtained for n-type indium phosphide doped with sulfur to a concentration of $1 \times 10^{17}$ to $3.5 \times 10^{19}$ (or saturation) with the range from $8 \times 10^{18}$ to $2 \times 10^{19}$ atoms/cm$^3$ yielding very low defect densities. Although various growth procedures may be used, the liquid-encapsulated Czochralski (LEC) method is generally employed. Also, p-type bulk indium phosphide often has low defect densities with zinc doping in the range $1 \times 10^{17}$ to $2 \times 10^{18}$ atoms/cm$^3$ or saturation yielding very low defect densities. The range from $1 \times 10^{18}$ to $2 \times 10^{18}$ atoms/cm$^3$ generally yields lowest defect densities. Other growth procedures may also be used including various temperature gradient procedures such as the Bridgeman process, horizontal and vertical gradient freeze methods, etc. A particularly interesting procedure, described in U.S. Pat. No. 4,404,172, issued to William A. Gault on Sept. 13, 1983, also yields low defect densities but at lower doping levels, e.g., $5-20 \times 10^{17}$ atoms/cm$^3$. Often, defect densities less than 100 cm$^{-2}$ are obtained by this procedure.

Bulk indium phosphide material that is doped n-type or p-type generally cannot be used directly for substrates in semiconductor devices because the high conductivity prevents sufficient isolation between adjacent circuit elements. (This is not a problem for discrete devices which are cut apart after fabrication.)

A particularly unique solution to this problem is the use of an insulating layer on top of the n-type or p-type indium phosphide substrate. Particularly good results are obtained with epitaxial layers of semi-insulating indium phosphide typically grown by metal organic chemical vapor deposition (MOCVD). Although a variety of dopants can be used to make the indium phosphide semi-insulating, (e.g., Cr, Fe), excellent results are obtained with Fe. Typical concentration ranges are $10^{15}$ to $10^{18}$ atoms/cm$^3$. This work is described in a number of references including "Growth of Fe-Doped Semi-Insulating InP by MOCVD" by J. A. Long et al. Journal of Crystal Growth, 69, pp. 10–14 (1984); "Electrical Characterization of Fe-Doped Semi-Insulating InP Grown By Metalorganic Chemical Vapor Deposition" by A. T. Macrander et al, Applied Physics Letters, 45, pp. 1297–1298 (1984).

Particularly desirable is a process for making integrated (or discrete) semiconducting circuits on indium phosphide substrates. Preferred is a rapid, inexpensive procedure for making such circuits where packing density can be made high and line design rules very small.

SUMMARY OF THE INVENTION

The invention is a process for fabricating devices comprising indium phosphide substrate with a portion of the surface of the indium phosphide substrate covered with semi-insulating indium phosphide in which a portion of the layer of semi-insulating indium phosphide is carrier-activated by ion implantation and annealing. A preferred aspect of this invention is the use of an n-type or p-type InP substrate (e.g., S or Zn levels of at least $10^{17}$ atoms/cm$^3$) which has particularly low dislocation density with a semi-insulating layer of iron-doped indium phosphide to provide an insulating layer and carrier activation by ion implantation and annealing to form the active portions of the device (e.g., FET). Since the layer dislocation density usually is determined by the dislocation density of the grown-on surface (i.e., substrate), this process yields devices with low defect densities and good electrical isolation from substrate and adjacent semiconductor elements. Defect densities less than $5\times 10^3$ or even $1\times 10^3$ defects/cm$^2$ can be obtained in this way. In a preferred aspect of the invention where the InP substrate is grown by liquid-encapsulated Czochralski and the sulfur or zinc concentration is within a factor of two of saturation, devices are obtained with defect densities of less than 100 or even 10 defects/cm$^2$. Similar results with low defect density are obtained from gradient freeze growth methods using sulfur doping in the concentration range from $1\times 10^{17}$ atoms/cm$^3$ to saturation. At these low defect densities, possible effects on integrated circuits are very unlikely. Also, part of the invention is the device structure comprising indium phosphide substrate with a portion of the surface of the indium phosphide surface covered with semi-insulating indium phosphide in which carrier activation has been achieved by ion implantation and annealing.

DETAILED DESCRIPTION

Figure 1:
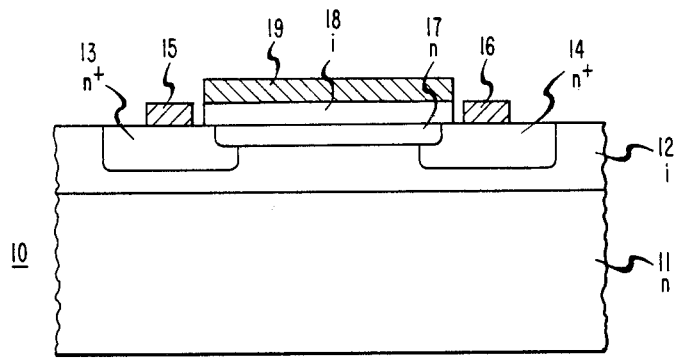
FIG. 1 shows a side view of a depletion-mode, n-channel, metal-insulator-semiconductor field effect transistor (MISFET) made in accordance with the invention.

The invention is based on the discovery that excellent carrier activation can be achieved in semi-insulating epitaxial indium phosphide layers on n-type or p-type indium phosphide substrates by ion implantation and anneal. A large variety of ions can be used for carrier activation including both n-type (donor) ions and p-type (acceptor) ions. Typical examples of donors are silicon, germanium, tin, sulfur, selenium and tellurium. Typical examples of acceptor ions are zinc, cadmium, mercury, beryllium, magnesium and manganese. Although ion implantation generally takes place at room temperature or moderate temperatures (say up to 300 degrees C.) with subsequent anneal, simultaneous ion implant and anneal is also useful.

Implantation is done by conventional means using equipment well known in the art. Much literature exists on the implantation of donor ions and acceptor ions in III-V semiconductors including, for example, "The Electrical Characteristics of InP Implanted with the Column IV Elements", by J. P. Donnelly et al., Solid State Electronics, Vol. 23, pp. 1151–1154 (1980) and "Ion-Implanted n- and p-Type Layers in InP", by J. P. Donnelly et al., Applied Physics Letters, Vol. 31, No. 7, pp. 418–420 (1977). In addition, several books have been written on ion implantation including Ion Implantation: Equipment and Techniques, Editors: H. Ryssel and H. Glawischnig, Springer-Verlag, New York, 1983 and Ion Implantation: Science and Technology, edited by J. F. Ziegler, Academic Press, Inc., New York, 1984.

In the ion implantation process, energetic charged particles (i.e., ions) are introduced into the epitaxial semi-insulating surface and then the implanted region annealed to reduce damage and permit migration of the implanted species to sites where they affect the conduction properties of the epitaxial region.

Typical ion energies involved in the implantation process range from 10 to 800 kev depending on the species involved, substrate involved and implantation depth desired. Preferred ion energy ranges are 300 to 500 kev, with 340 to 410 kev most preferred. Typical ion dosages vary from $10^{10}$ to $10^{16}$ ions/cm$^2$. Ion implantation has a number of advantages over conventional procedures for doping semiconductor material. These advantages include precise control over total dose, depth profile, and area uniformity. Other advantages include low temperature processing (important for many III-V compounds including indium phosphide) and added flexibility in device fabrication. For example, a self-alignment procedure can be used to implant junctions.

As stated above, one of the advantages of ion implantation over other doping procedures for epitaxial layers (e.g., diffusion) is the lower temperature to which the semiconductor is exposed during processing. This is particularly critical for III-V compounds such as indium phosphide. After ion implantation, the epitaxial layer is exposed to an annealing procedure to reduce damage done by the implantation procedure and promote migration of the implanted ions to sites in the epitaxial layer where conductivity effects are evident. The temperature and duration of the annealing procedure may vary over large limits and often depends on the implanted species, substance being implanted, percent activation desired, etc. Typical temperature ranges are 600 to 850 degrees C., and typical durations are one minute to one hour with 15 to 20 minutes generally preferred. Annealing times that are too short often result in too little activation; annealing times that are too long do not result in increased activation but do expose the semiconductor material to the possibility of surface damage. The anneal is often carried out in an atmosphere comprising phosphorus-containing gas such as $PH_3$ in $H_2$ (e.g., $4 \times 10^{-3}$ mole fraction $PH_3$) and can be performed without a protective capping layer. Rapid thermal anneal is also useful as described in a number of references as, for example, pages 492-497 of the H. Ryssel et al. reference cited above or pages 185-186 of the J. F. Ziegler reference cited above. Protective capping layers may also be used during the annealing process as described in "Dielectrics for Annealing of Ion-Implanted III-V Compound Semiconductors" by S. Singh, abstract No. 187, Journal of the Electrochemical Society: REVIEWS AND NEWS, Vol. 132, No. 8, p. 350C, Las Vegas, Nevada Meeting, 1985.

Also, excellent results are obtained when the ion implantation is carried out at elevated temperatures. Although quite high temperatures may be used, usually temperatures are limited by apparatus considerations to 300 degrees C. The temperature range from 100 to 200 degrees C. is usually used.

The thickness of the epitaxial semi-insulating layer on top of the n-type or p-type indium phosphide substrate may vary over large limits. Thin layers (e.g., 2-3 $\mu$m) are convenient because it minimizes growth time. However, minimum thicknesses are established by electrical isolation considerations; that is, there must be sufficient insulating material between the implanted region and the conducting substrate to ensure electrical isolation of the semiconducting circuit elements. For shallow ion implantation, insulating layer thicknesses as little as $\frac{1}{2}$ $\mu$m may be sufficient but usually layer thicknesses between 1 and 4 $\mu$m are preferred. Generally, maximum layer thickness is determined by convenience and growth time rather than device characteristic considerations. For example, layer thicknesses over about 30 $\mu$m generally do not have any device advantages and growth takes considerable time.

An understanding of the invention is facilitated by a description of the fabrication procedure for a particular semiconductor device. Experiments were carried out using three substrate materials: an n-type InP substrate with a sulfur concentration of $1.7 \times 10^{19}$ cm$^{-3}$(A); an n-type InP substrate with sulfur concentration of $3.1 \times 10^{19}$ cm$^{-3}$(B); and a semi-insulating, iron-doped substrate (C). Each substrate had a semi-insulating, InP layer grown by metal organic chemical vapor deposition with thickness as indicated in Table I. The semi-insulating layers were iron-doped and had a resistivity in the range $1-3 \times 10^7$ ohm-cm. Ions were implanted over a broad area and metalizations were put down for various measurements in the conventional way.

The implantation was carried out at room temperature in a 400 kev, post-acceleration analysis, ion implanter with the sample stationary and the beam rastered. The implanted ion was doubly charged $^{28}$Si at a voltage of 175 kv. The fluence was $1 \times 10^{13}$ ions/cm$^2$, and the (100) oriented wafers were tilted by 7 degrees to avoid channeling. Annealing was carried out at about 700 degrees C. for about 16 minutes in an atmosphere of $4 \times 10^{-3}$ mole fraction $PH_3$ in $H_2$.

Table I contains a summary of data obtained by various measurements on the three wafers. The various measurements include Hall-effect measurements, standard capacitance-voltage measurements and electrochemical capacitance-voltage profiler measurements. For wafer C (which had a semi-insulating substrate), a Hg Schottky diode configuration with no backside contact was used for the capacitance-voltage measurements.

Some of the results deduced from these measurements are given in Table I. For example, the peak concentrations for the various samples varies from about $2 \times 10^{17}$ to $2.4 \times 10^{17}$ atoms/cm$^3$ and the depth of peak concentration was 0.36 and 0.32 for samples A and B. Hall measurements yield a mobility of about 2700 cm$^2$-volt$^{-1}$-sec$^{-1}$ for sample C. Activation percentages were also high; generally in the range from 55 to 75 percent. These measurements show that unique, high performance devices can be made using ion implantation of semi-insulating layers on InP substrates. Similar results may also be possible using other doping elements such as germanium, tin, sulfur, selenium and tellurium. Similar results are expected with acceptor doping elements such as zinc, cadmium, mercury, beryllium, magnesium and manganese.

A large variety of devices can be made in accordance with the invention. These devices include field effect transistors (FETs) including metal-semiconductor field effect transistors (MESFETs), junction field effect transistors (JFETs), and metal-insulator-semiconductor field effect transistors (MISFETs). Although various optical devices such as lasers, light-emitting diodes and photodetectors are of interest, greater interest is in circuit arrays on the same chip as the optical device which act as amplifiers, driver circuits, etc. Particularly important are semiconductor devices with large arrays (more than 10) of circuit elements (MISFETs, JFETs, MESFETs, etc.) for use as memory elements, logic elements, etc.

FIG. 1 shows a side view of an n-channel, depletion-mode metal-insulator-semiconductor field effect transistor (MISFET) 10 made in accordance with the invention. The device is made up of a substrate 11 covered with a semi-insulating InP layer 12 and two heavily-doped regions, one for the source 13 and one for the drain 14. The substrate 11 is made of sulfur-doped InP,

TABLE I

| WAFER | LAYER THICKNESS | PEAK CARRIER CONCENTRATION | ION RANGE* | SHEET CARRIER CONCENTRATION |
|---|---|---|---|---|
| ON A n-TYPE InP SUBSTRATE: | | | | |
| A | 1. $\mu$m | $2.4 \times 10^{17}$ cm$^{-3}$ | .36 $\mu$m | |
| B | 2.4 $\mu$m | $2.2 \times 10^{17}$ cm$^{-3}$ | .32 $\mu$m | |
| ON A SEMI-INSULATING InP SUBSTRATE: | | | | |
| C | 4. $\mu$m | $2. \times 10^{17}$ cm$^{-3}$ | | $0.55 \times 10^{13}$ cm$^{-2}$ |

*The depth at which the carrier concentration is a maximum.

and the semi-insulating layer is iron-doped and grown by MOCVD. The source and drain regions are made by ion implantation of silicon and contacted by metalizations 15 and 16. The n-channel region 17 is also made by ion implantation. A dielectric layer 18 such as silicon dioxide ($SiO_2$), aluminum dioxide ($Al_2O_3$), or silicon nitride (SiN) is deposited on the semiconductor surface. The gate metal 19 is typically gold or gold-containing alloy. Many devices use arrays of this type of FET to form memories, logic circuits, amplifiers, etc.

Figure 2:
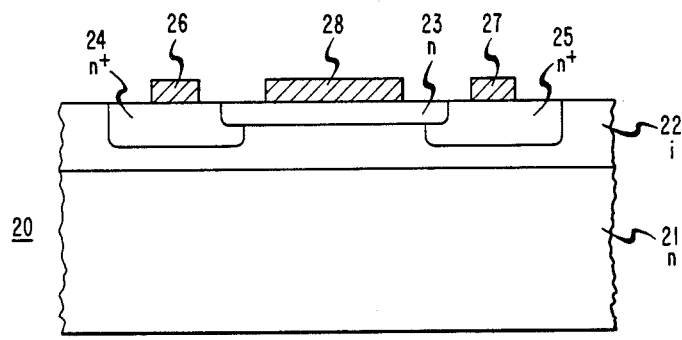
FIG. 2 shows a side view of an n-channel, metal-semiconductor field effect transistor (MESFET) made in accordance with the invention.

FIG. 2 shows a side view of another structure. The device 20 is a metal-semiconductor field effect transistor (MESFET). It consists of an n-type InP substrate 21 and a semi-insulating InP layer 22 on top. This semi-insulating layer is iron-doped and is grown by MOCVD. The device has a number of ion implanted regions with silicon being used as the implanted ion. A shallow region 23 is used as the channel layer and more heavily doped regions 24 and 25 as the source and drain regions. The source and drain electrodes 26 and 27 are also shown. The gate electrode 28 is deposited directly on the semiconductor surface. These same devices may also be made using p-type source, drain, and channel implants and channel conduction via holes. Combinations of n-channel FETs and p-channel FETs are often used in complimentary type circuits typically used in memory and logic type circuits.

Figure 3:
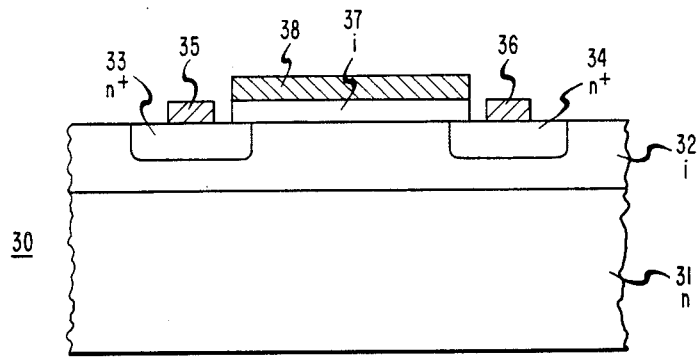
FIG. 3 shows a side view of an n-channel, enhancement mode, metal-insulator-semiconductor field effect transistor (MISFET) made in accordance with the invention.

Enhancement-mode FET circuits can also be made using the inventive process. A typical device 30 is shown in FIG. 3. The device is made up of an n-type InP substrate 31, layer of semi-insulating InP, iron-doped and grown by MOCVD 32, and two regions of n+ doping, one for source 33 and one for drain 34. The source 35 and drain 36 electrodes are also shown as well as the dielectric insulator layer 37 and the gate electrode 38. Typically, the gate metal is titanium-platinum-gold. This type of device is generally referred to as an enhancement-mode, n-channel, metal-insulator-semiconductor field effect transistor (MISFET) and may be used in arrays as amplifiers, memory arrays and logic circuits. By using p-type implants for source and drain, a p-channel enhancement mode MISFET can also be made.

Figure 4:
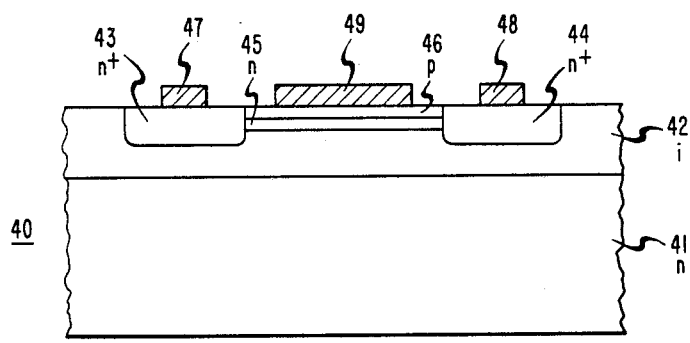
FIG. 4 shows a side view of an n-channel, junction field effect transistor (JFET) made in accordance with the invention.

Finally, both n-type and p-type implants may be used in tandem to form a junction field effect transistor (JFET). FIG. 4 shows a side view of such a device 40 with an n-type, sulfur-doped InP substrate 41, semi-insulating InP layer 42 and source 43 and drain 44 and channel 45 regions made in accordance with the invention. Also shown is a p-type region 46 formed by ion implantation (but it may also be formed by diffusion). Also shown are the source 47 and drain 48 electrodes and the gate electrode 49. Various metal compositions can be used for the electrodes; for example, titanium-platinum-gold for the gate electrode. Arrays of these devices are useful for a variety of circuits including amplifier circuits, logic circuits, memory circuits. Also, arrays of complimentary circuits made up of n-channel and p-channel enhancement-mode FETs (including MISFETs, JFETs, MESFETs, etc.) are also useful.

Various other devices can be made using this procedure including bipolar devices, p-n junction devices, etc.

What is claimed is:

1. A process for fabricating a device comprising substrate and a first region contacting at least a portion of the surface of the substrate, said substrate comprising n-type or p-type indium phosphide and said first region comprising semi-insulating indium phosphide doped with iron and grown by MOCVD and ion-implanting at least a portion of the first region for carrier-activation.

2. The process of claim 1 in which the n-type indium phosphide is doped with sulfur in the concentration range from about $1 \times 10^{17}$ atoms/cm$^3$ to saturation.

3. The process of claim 1 in which the p-type indium phosphide is doped with zinc in the concentration range from $1 \times 10^{17}$ to $2 \times 10^{18}$ atoms/cm$^3$.

4. The process of claim 1 in which the concentration of iron is between $10^{15}$ and $10^{18}$ atoms/cm$^3$.

5. The process of claim 1 in which the defect density on the surface of the layer of semi-insulating indium phosphide is less than $5 \times 10^3$ defects/cm$^2$.

6. The process of claim 1 in which the ion being implanted is a donor ion.

7. The process of claim 1 in which the ion being implanted is an acceptor ion.

8. The process of claim 1 in which the ion energy in the ion implantation is between 10 and 800 kev.

9. The process of claim 1 in which the anneal is carried out in the temperature range from 600 to 800 degrees C.

10. The process of claim 1 in which the anneal is carried out in an atmosphere comprising a gas comprising phosphorus.

11. The process of claim 1 in which the ion implantation takes place in the temperature range between 100 and 300 degrees C.

12. The process of claim 1 in which the thickness of the first region is between $\frac{1}{2}$ and 10 $\mu$m.

13. The process of claim 2 in which the n-type indium phosphide has a sulfur concentration of from about $8 \times 10^{18}$ to $3.5 \times 10^{19}$ atoms/cm$^3$.

14. The process of claim 3 in which the concentration of zinc is from $1 \times 10^{18}$ to $2 \times 10^{18}$ atoms/cm$^3$.

15. The process of claim 4 in which the defect density is less than $10^3$ defects/cm$^2$.

16. The process of claim 6 in which the donor ion is at least one ion selected from the group consisting of silicon, germanium, tin, sulfur, selenium and tellurium.

17. The process of claim 7 in which the acceptor ion is at least one ion selected from the group consisting of zinc, cadmium, mercury, beryllium, magnesium and manganese.

18. The process of claim 8 in which the ion energy is between 300 and 500 kev.

19. The process of claim 9 in which the duration of the anneal is between one minute and one hour.

20. The process of claim 10 in which the atmosphere comprises $PH_3$ in $H_2$.

21. The process of claim 12 in which the thickness of the first region is between 1 and 4 $\mu$m.

22. The process of claim 15 in which the defect density is less than 100 defects/cm$^2$.

23. The process of claim 18 in which the ion energy is between 340 and 410 kev.

24. The process of claim 19 in which the duration is between 15 and 20 minutes.

25. The process of claim 21 in which the thickness of the first region is between 2 and 3 $\mu$m.

26. The process of claim 22 in which the defect density is less than 10 defects/cm$^2$.

* * * * *

UNITED STATES PATENT AND TRADEMARK OFFICE
CERTIFICATE OF CORRECTION

PATENT NO. : 4,738,934

DATED : April 19, 1988

INVENTOR(S) : Wilbur D. Johnston, Jr., Judith A. Long, Albert T. Macrander, Bertram Schwartz, Shobha Singh It is certified that error appears in the above—identified patent and that said Letters Patent is hereby corrected as shown below:

IN THE CLAIMS

Column 8, line 24 - "800" should be --850--

Signed and Sealed this

Twelfth Day of June, 1990

Attest:

HARRY F. MANBECK, JR.

Attesting Officer

Commissioner of Patents and Trademarks